(12) United States Patent
Zhang

(10) Patent No.: US 10,211,077 B2
(45) Date of Patent: Feb. 19, 2019

(54) METHOD FOR DEBONDING TEMPORARILY ADHESIVE-BONDED CARRIER-WORKPIECE PAIR BY USING HIGH PRESSURE SOLVENT

(71) Applicant: DIDREW TECHNOLOGY (BVI) LIMITED, San Jose, CA (US)

(72) Inventor: Chunbin Zhang, Fremont, CA (US)

(73) Assignee: DIDREW TECHNOLOGY (BVI) LIMITED, San Jose, CA (US)

(*) Notice: Subject to any disclaimer, the term of this patent is extended or adjusted under 35 U.S.C. 154(b) by 0 days.

(21) Appl. No.: 15/916,265

(22) Filed: Mar. 8, 2018

(65) Prior Publication Data

US 2018/0269077 A1    Sep. 20, 2018

Related U.S. Application Data

(60) Provisional application No. 62/601,289, filed on Mar. 17, 2017.

(51) Int. Cl.

| | |
|---|---|
| *H01L 21/683* | (2006.01) |
| *B32B 43/00* | (2006.01) |
| *H01L 21/67* | (2006.01) |
| *H01L 21/78* | (2006.01) |
| *C09J 7/20* | (2018.01) |
| *C09J 5/00* | (2006.01) |

(52) U.S. Cl.
CPC ........ *H01L 21/6715* (2013.01); *B32B 43/006* (2013.01); *C09J 5/00* (2013.01); *C09J 7/201* (2018.01); *H01L 21/6708* (2013.01); *H01L 21/67051* (2013.01); *H01L 21/67092* (2013.01); *H01L 21/6836* (2013.01); *H01L 21/7813* (2013.01); *B32B 43/003* (2013.01); *B32B 2457/14* (2013.01); *C09J 2203/326* (2013.01); *C09J 2205/302* (2013.01); *H01L 2221/68381* (2013.01); *Y10S 156/93* (2013.01); *Y10S 156/941* (2013.01); *Y10T 156/1111* (2015.01); *Y10T 156/1126* (2015.01); *Y10T 156/1933* (2015.01)

(58) Field of Classification Search
CPC ......... Y10T 156/1111; Y10T 156/1933; Y10T 156/1126; Y10S 156/93; Y10S 156/941; H01L 2221/68381; B32B 43/006
See application file for complete search history.

(56) References Cited

U.S. PATENT DOCUMENTS

| | | | |
|---|---|---|---|
| 6,821,376 B1 * | 11/2004 | Rayssac | H01L 21/67092 156/382 |
| 9,254,636 B2 | 2/2016 | Price | |

(Continued)

FOREIGN PATENT DOCUMENTS

WO    WO-2016128079 A1 *    8/2016    ............ B26F 3/004

*Primary Examiner* — Mark A Osele
(74) *Attorney, Agent, or Firm* — LeClairRyan

(57) ABSTRACT

A method of debonding a temporarily adhesive-bonded carrier-workpiece pair employs a stream of a solvent at a high pressure. The carrier and the workpiece are bonded with an adhesive that is dissolvable in a selected solvent. The workpiece such as a device wafer may have been thinned and processed. The solvent is applied to the adhesive at a high pressure to debond and dissolve the adhesive with high throughput. The dissolved adhesive can be recycled and later reused, thus lowering the cost of the whole bonding and debonding process.

20 Claims, 2 Drawing Sheets

(56) References Cited

U.S. PATENT DOCUMENTS

| | | |
|---|---|---|
| 9,381,732 B2 | 7/2016 | Lindner |
| 2002/0029849 A1* | 3/2002 | Ohmi ................ H01L 21/67092 |
| | | 156/708 |
| 2003/0010445 A1* | 1/2003 | Yanagita ........... H01L 21/67092 |
| | | 156/708 |
| 2003/0121601 A1 | 7/2003 | Tajima |
| 2007/0214649 A1 | 9/2007 | Hess |
| 2010/0107834 A1 | 5/2010 | Lai |
| 2010/0133373 A1 | 6/2010 | Klabunde |
| 2012/0000613 A1* | 1/2012 | Thallner ........... H01L 21/67092 |
| | | 156/703 |
| 2012/0276818 A1* | 11/2012 | Cramer ................... B24C 1/045 |
| | | 451/38 |
| 2017/0018450 A1 | 1/2017 | Tang |
| 2018/0040489 A1* | 2/2018 | Fehkuhrer ............... B26F 3/004 |

\* cited by examiner

METHOD FOR DEBONDING TEMPORARILY ADHESIVE-BONDED CARRIER-WORKPIECE PAIR BY USING HIGH PRESSURE SOLVENT

TECHNICAL FIELD

Embodiments of this disclosure relate generally to bonding and debonding of carrier-workpiece pairs. In particular, various embodiments of debonding temporarily bonded carrier-workpiece pairs by means of applying high pressure solvents are described.

BACKGROUND

In many applications, a workpiece needs to be thinned or processed with the support of a carrier to make the workpiece mechanically stable. The workpiece can be temporarily bonded to the carrier using adhesives. At end of the application, the workpiece needs to be debonded or separated from the carrier, and cleaned of any residue adhesives. For example, in semiconductor wafer thinning process, the workpiece can be a semiconductor wafer or device wafer on which thousands of chips are finally made. Widespread applications of smartphones, tablets, and portable consumer electronics are driving semiconductor packaging towards thinner, smaller, and more integrated directions. Wafer-level packaging (WLP) techniques is rapidly reducing the size of packages for easier integration into mobile electronics. The wafer thinning process used in device miniaturization and packaging has attracted more and more attention. Thin wafers offer the benefits of improved heat dissipation, three-dimensional (3D) stacking, reduced resistance, and substrate flexibility. In through silicon via (TSV) based 3D-IC wafer level packaging, wafers need to be thinned to less than 100 microns (μm). The thinning process needs to be high throughput and low cost to be suitable for volume production.

Wafer thinning is primarily achieved by mechanical grinding (back-grinding), polishing, and chemical etching. Thin wafers, especially ultra-thin wafers (thickness less than 60 microns or even 30 microns) are very unstable, and more susceptible to stress than traditional thick wafers. During processing, thin wafers may be easily broken and warped. Therefore, temporary bonding to a rigid support carrier is required. Thinned device wafers need to be supported for use on the backside in grinding process and subsequent processes such as photolithography, etching, plating, vacuum deposition, reactive ion etching, and so on.

SUMMARY

The present disclosure provides a novel method of debonding or separating a temporarily adhesive-bonded carrier-workpiece pair using high-pressure solvent streams or sprays. The method can be used for processing various workpieces of different shapes such as round, rectangle, or square shapes, of different materials such as silicon, gallium arsenide, sapphire, glass, metal, of different thicknesses, in various applications where the workpieces can be optical lenses, semiconductors, liquid crystal displays (LCD), solar panels, and so on. The method is particularly useful for debonding temporarily adhesive-bonded semiconductor wafers in three-dimensional integrated circuit (3D-IC) semiconductor wafer level packaging.

The disclosed debonding method using high-pressure solvent streams or sprays can advantageously enhance process efficiency, simplify procedures, provide high wafer throughput, and reduce or eliminate defects such as device wafer breakage and internal device damage. The method can greatly increase the range of selection of polymeric adhesives for the use of temporary workpiece bonding and debonding. The use of recyclable polymer adhesive such as thermoplastics is of particular benefit as it can greatly lower the overall cost.

In one aspect of the disclosure, a method of debonding a temporarily bonded carrier-workpiece pair comprises holding in place a carrier-workpiece pair temporarily bonded with an adhesive, and applying a stream of a liquid solvent to the adhesive to debond the carrier-workpiece pair. The liquid solvent is capable of dissolving the adhesive. The stream of the liquid solvent is applied at a pressure ranging from 60 to 10000 pounds per square inch (psi), preferably 300 to 3000 psi.

The stream of the liquid solvent can be applied to the adhesive in the form of a needle, a fan, a blade, or any combination thereof.

The stream of the liquid solvent can be applied with a pump system allowing the stream of the liquid solvent to move in three dimensions (X-Y-Z) relative to the adhesive at a linear or nonlinear velocity.

In some embodiments, the liquid solvent can be heated to a temperature below its flashpoint before applying a stream of the liquid solvent to the adhesive.

In some embodiments, the carrier-workpiece pair is temporarily bonded with a layer of a thermoplastic polymer adhesive. The workpiece can be a semiconductor wafer, an optical lens, quartz, a sapphire wafer, display glass, a liquid crystal display, a thin metal plate, a thin membrane, or a film. In some embodiments, the carrier can be perforated, and the stream of the liquid solvent can be applied to the adhesive from the backside of the carrier.

This Summary is provided to introduce selected embodiments in a simplified form and is not intended to identify key features or essential characteristics of the claimed subject matter, nor is it intended to be used as an aid in determining the scope of the claimed subject matter. The selected embodiments are presented merely to provide the reader with a brief summary of certain forms the invention might take and are not intended to limit the scope of the invention. Other aspects and embodiments of the disclosure are described in the section of Detailed Description.

BRIEF DESCRIPTION OF THE DRAWINGS

These and various other features and advantages will become better understood upon reading of the following detailed description in conjunction with the accompanying drawings and the appended claims provided below, where:

DETAILED DESCRIPTION

Various embodiments of methods for debonding temporarily bonded carrier-workpiece pair are described. It is to be understood that the disclosure is not limited to the particular embodiments described. An aspect described in conjunction with a particular embodiment is not necessarily limited to that embodiment and can be practiced in any other embodiments.

Various embodiments are described with reference to the figures. It should be noted that some figures are not necessarily drawn to scale. The figures are only intended to facilitate the description of specific embodiments, and are not intended as an exhaustive description or as a limitation on the scope of the disclosure. Further, in the figures and description, specific details may be set forth in order to provide a thorough understanding of the disclosure. It will be apparent to one of ordinary skill in the art that some of these specific details may not be employed to practice embodiments of the disclosure. In other instances, well known components may not be shown or described in detail in order to avoid unnecessarily obscuring embodiments of the disclosure.

All technical and scientific terms used herein have the meaning as commonly understood by one of ordinary skill in the art unless specifically defined otherwise. As used in the description and appended claims, the singular forms of "a," "an," and "the" include plural references unless the context clearly dictates otherwise. The term "or" refers to a nonexclusive "or" unless the context clearly dictates otherwise.

As used herein, the terms "temporarily bonded," "temporary bonding," and their grammatical equivalents, refer to embodiments where the bonding between a carrier and a workpiece is temporary and will be removed upon completion of one or more processing steps on the workpiece.

Figure 1:
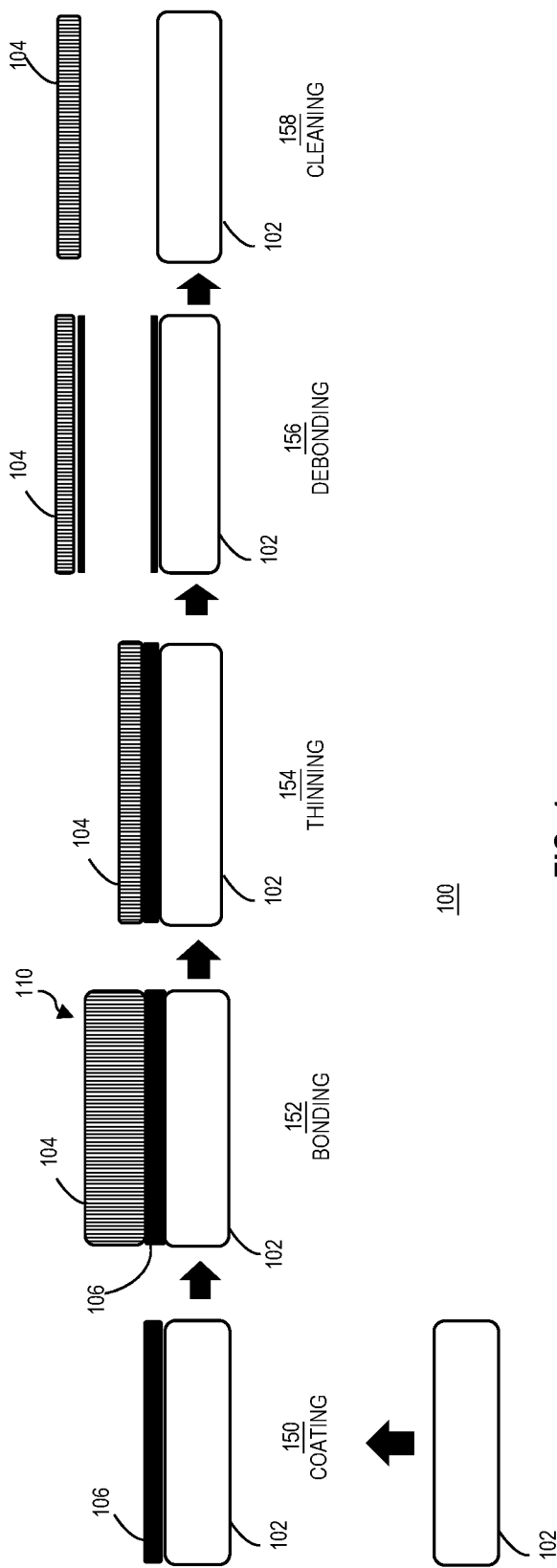
FIG. 1 schematically illustrates a process of temporarily bonding and debonding a carrier-workpiece pair according to embodiments of the disclosure.

FIG. 1 schematically illustrates a process 100 of temporarily bonding and debonding a carrier-workpiece pair according to embodiments of the disclosure. As shown, a carrier 102 can be coated with an adhesive 106 at step 150. A workpiece 104, which may have been applied with a protective layer (not shown), can be temporarily bonded with the adhesive-coated carrier 102 at step 152, forming a temporarily bonded carrier-workpiece pair 110. The temporarily bonded carrier-workpiece pair 110 can be formed by contacting the workpiece 104 facedown with the adhesive-coated carrier 102 under vacuum or pressure. The workpiece 104, which is supported by the carrier 102 through the bonding of the adhesive 106, can be then thinned and/or further processed from the backside, as shown at step 154. Once the thinning and/or other processing are completed, the workpiece 104 can be debonded, or separated, from the carrier 102, as shown at step 156. The workpiece 104 and carrier 102 can be then cleaned at step 158.

The workpiece 104 can be a semiconductor device wafer, an optical lens, quartz, a sapphire wafer, display glass, an LED crystal, a thin metal plate, a thin membrane, a film, or the like. The workpiece 104 can be made of silicon, polysilicon, silicon oxide, silicon-germanium, silicon nitride, gallium arsenide, gallium nitride, gallium phosphide, alumina titanium carbide, or silicon carbon. The workpiece 104 can also be metals such as copper, aluminum, steel, gold, tungsten, tantalum, low K dielectrics, metal nitrides, metal alloys, silicides, and any combination thereof. Indeed, any suitable workpiece made of any materials in any form can be used in the method of this disclosure.

The carrier 102 can be any suitable carrier that has sufficient mechanical strength. The carrier 102 can be made of the same material as that of the workpiece 104. In semiconductor temporary wafer bonding and debonding process, the carrier 102 can be made of silicon, glass, etc. During the debonding step using such as solvent spraying as will be described below, the carrier 102 can be applied with a certain degree of pulling force to facilitate separation of the carrier from the workpiece.

Suitable adhesives 106 that can be used in the temporary bonding process include thermoplastic polymers. Polymers of slight crosslinking and still solvable in a solvent may still be used. In some embodiments, thermoplastic polymeric adhesives are preferred because they can be recycled and reused after post debonding reclaim treatment, and therefore the total cost of the whole bonding and debonding process can be greatly reduced. Any suitable polymers can be used so long they meet the specifications as required by the processing conditions such as low outgassing, film uniformity, solubility in solvents, temperature tolerance, etc. The polymers can be polyimides, rubbers, cyclic olefins, polyacrylates, poly methyl methacrylate, polyurethanes, polycarbonates, polyethylene terephthalate, cellulose, polyesters, polystyrenes, epoxies, silicones, polyamides, polysulfones, etc. or combination thereof. Photoresists such as those manufactured by JSR Corporation of Japan and AZ series photoresists manufactured by AZ Electronic Materials (Merck) of Germany can also be used. In some embodiments, the polymers can be used in formulations which contain polymers as binders and other fillers and additives such as antioxidants, plasticizers. In some embodiments, single polymers are preferred for ease of recycling and reuse of the polymers.

The polymeric adhesives 106 can be applied to the carrier 102 using spin coating, spray coating, slot coating, knife coating, and other available coating techniques from solutions. The polymeric adhesives 106 can also be applied in dry film lamination. The adhesives 106 should form as uniform films as possible. Bonding of a workpiece such as a device wafer to a carrier wafer coated with adhesives can be accomplished with bonders commercially available from e.g. EVG of Austria, Suss MicroTec of Germany, Tokyo Electron Ltd. of Japan, and other companies, or inhouse made bonders. In some embodiments, the thickness of the polymer adhesive coated on the carrier may range from 1 to 500 microns.

The adhesive bonded carrier-workpiece pair 110 such as a device wafer-carrier wafer pair can be safely subjected to thinning such as back-grinding and chemical-mechanical polishing (CMP). By way of example, a device wafer 104 may be thinned to have a thickness of less than 100 microns. In some applications, a device wafer 104 may be thinned to have a thickness of less than 60 microns or even 30 microns. After thinning, other backside processing can be carried out too, such as through silicon via (TSV) formation, etching such as deep reactive-ion etching (DRIE), metal and dielectric deposition, patterning such as photolithography, via etching, plasma ashing, bonding pads, passivating, annealing, and any combinations thereof. After these processes, the device wafer 104 is ready to be debonded or separated from the carrier wafer 102 and cleaned of the adhesive.

The debonding step 156 can be critical. It is desirable that the debonding step is high throughput, defect less, damage less, and cost effective. The present disclosure provides a debonding method using high-pressure solvent streams or sprays, which can enhance process efficiency, simplify procedures, provide high wafer throughput, and reduce or eliminate defects such as device wafer breakage and internal device damage. The debonding method provided by the present disclosure also greatly increases the range of selection of polymeric adhesives for use in temporary bonding and debonding as a result of solvent use. The use of recyclable thermoplastics is of particular benefit as it can greatly lower the overall cost. The disclosed debonding method allows separation of the workpiece from the carrier and cleaning to be combined into one integrated step to provide high throughput and lower costs.

In accordance with embodiments of the disclosure, a temporarily adhesive-bonded carrier-workpiece pair is debonded or separated using high-pressure solvent streams or sprays. The carrier-workpiece pair temporarily bonded with an adhesive can be held in place using any suitable means. A stream of a liquid solvent is applied to the adhesive at a high pressure ranging from 60 to 10000 pounds per square inch (psi) to debond the carrier-workpiece pair. The liquid solvent is capable of dissolving the adhesive.

The solvent or solvents used in the debonding method of the disclosure can be a single solvent or a combination of several solvents. The selection of solvents may be dictated by the use of polymer adhesives. The selection of a solvent to a particular polymer generally can be based on the "like dissolves like" principal. Solubility parameter is a factor to consider for selection of a solvent or combination of solvent mixtures. The solvent can also be in the form of a formulation. Many of stripping solutions used in the microelectronics industry can be used. Suitable solvents include n-methylpyrrolidone (NMP), dimethyl sulfoxide (DMSO), ethyl lactate ethyl acetate, butyl acetate, methyl ethyl ketone (MEK), propylene glycol methyl ethylene acetate (PG-MEA), acetone, cyclopentenone, tetrahydrofuran (THF), dimethyl acetamide, hydrocarbons, cyclic hydrocarbons, or strippers made of these solvents as main components. Examples of photoresist removers and strippers include AZ100, Technistrip P1316, P1331, NI555, etc. For example, NMP can be used if polyimide type polymer "durimide" made by Fujifilm Holdings Corporation is used as the temporary bonding adhesive. Water-containing solvents (water content between 0 to 100 percent) can also be used for environmental considerations so long they can carry the adhesive away during chemical and mechanical debonding.

Figure 2:
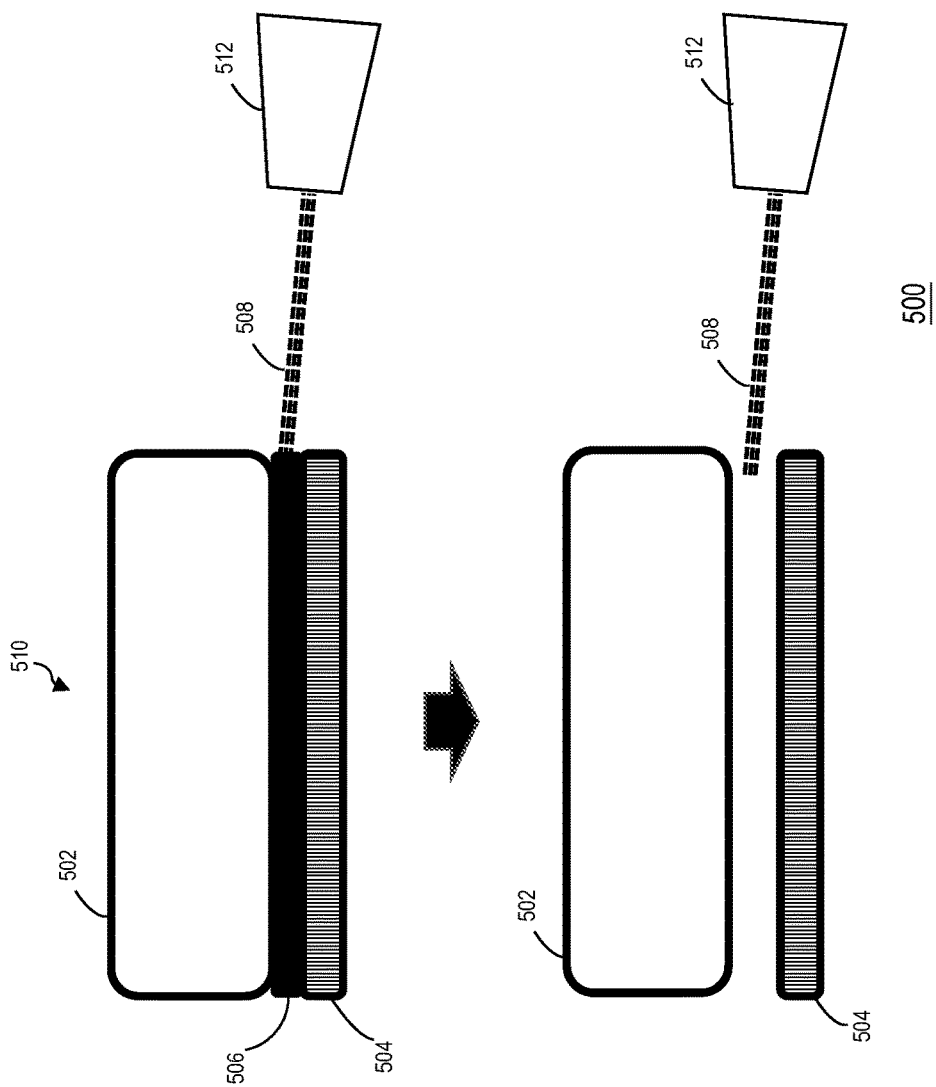
FIG. 2 schematically illustrates a method of debonding a temporarily bonded carrier-workpiece pair according to an exemplary embodiment of the disclosure.

FIG. 2 schematically illustrates a method 500 of debonding a temporarily bonded carrier-workpiece pair 510 according to an embodiment of the disclosure. For illustration purpose, the temporarily bonded carrier-workpiece pair 510 may include a carrier wafer 502 and a device wafer 504 temporarily bonded by a layer of an adhesive 506. The device wafer 504 may be a thinned device wafer having a thickness of e.g. less than 100 microns, or less than 60 microns. The carrier wafer 502 may be made of e.g. silicon, glass, etc. The adhesive 506 that temporarily bonds the carrier wafer 502 and the device wafer 504 may be a thermoplastic polymer adhesive.

FIG. 2 on the top shows a view of a cross-section of the carrier wafer-device wafer pair 510 held in place e.g. in a horizontal orientation. The carrier wafer-device wafer pair 510 may also be held in place in other suitable orientations. By way of example, the device wafer 504 can be held in place by a vacuum chuck, frame, or mechanical pins. The carrier wafer can also be held by a vacuum chuck, frame, or mechanical pins. It should be understood that in order to separate the carrier wafer 502 from the device wafer 504, the carrier wafer 502 should not be held too tightly to negatively affect separation. It is preferable that the carrier wafer 502 is held with a slight pulling force at the back to facilitate the separation of carrier wafer 502 from the device wafer 504. As the separation propagates to certain degree, the carrier wafer 502 is detached from the device wafer 504, physically (no adhesive to connect the two).

Still referring to FIG. 2, a stream of liquid solvent 508 can be applied to the adhesive 506 to debond the carrier wafer-device wafer pair 510. In the exemplary embodiment shown in FIG. 2, the stream of liquid solvent 508 is applied to the adhesive 506 via a pump system including a nozzle 512 coupled to a pump via a pipe (not shown). A high-pressure generating pump can be used so that the stream of liquid solvent 508 flowing out of the nozzle 512 provides a high pressure. As used herein, the pressure of the stream of liquid solvent is defined as the operating pressure of the pump. Preferably, the stream of the liquid solvent 508 is applied to the adhesive at a pressure ranging from 60 to 10000 pounds per square inch (psi). In some preferred embodiments, the pressure of the solvent stream is more than 500 psi to effect fast debonding.

The high-pressure stream of liquid solvent 508 can be applied in the form of a needle, blade, fan, or any combination thereof through the use of a suitable nozzle. The stream of the liquid solvent 508 can be targeted to the adhesive 506 in a certain angle e.g. ranging from 0 to 80 degrees with respect to the layer of the adhesive. Alternatively or additionally, the carrier wafer 502 can be perforated so that the high-pressure solvent stream or spray can be applied at the backside of the carrier wafer.

In some embodiments, the nozzle 512 of the pump system can move so that the high-pressure solvent stream 508 can be applied to the adhesive 506 in a particular fashion such as in a scanning fashion. The nozzle can move in a vibrational mode or in a three-dimensional (X-Y-Z) mode to allow the solvent stream move accordingly. The nozzle can move at a linear speed or nonlinear speed. Moving the nozzle and thus the solvent stream can maximize or increase debonding speed. In some embodiment, the solvent can also be heated to a temperature below its flash point for fast removal of the adhesive.

FIG. 2 on the bottom shows that a high-pressure solvent stream or spray may continue after the device wafer 504 has been debonded or separated from the carrier wafer 502, to remove residual adhesives from the device wafer 504 and/or carrier wafer 502, or to clean the device wafer 504 and/or carrier wafer 502. In removing adhesives or cleaning the device wafer 504 and/or carrier wafer 502, the same nozzle 512 can be used. Alternatively, a different nozzle can be used to more completely clean the device wafer. Different spray nozzles can be used for rinsing and cleaning. The device wafer 504 can then be dried and removed to continue to the next operation. In some preferred embodiments, the nozzle or tools for high-pressure solvent debonding the carrier wafer-device wafer pair 510 can also be used for cleaning the carrier wafer 502 and/or the device wafer 504 so that the debonding and cleaning can be combined in one tool. As such, the footprint of debonding and cleaning tools in a wafer fab can be greatly reduced.

Embodiments of debonding temporarily bonded carrier-workpiece pairs have been described. Those skilled in the art will appreciate that various other modifications may be made. All these or other variations and modifications are contemplated by the inventors and within the scope of the invention.

What is claimed is:

1. A method of debonding a temporarily bonded carrier-workpiece pair, comprising:
holding a carrier and a workpiece as a carrier-workpiece pair temporarily bonded with an adhesive;
applying a stream of a liquid solvent to the adhesive to debond the carrier-workpiece pair; and
while applying the stream of the liquid solvent, controlling the stream of solvent to move in three dimensions (X-Y-Z) relative to the adhesive, wherein the liquid solvent is capable of dissolving the adhesive and the stream of the liquid solvent is applied at a pressure ranging from 60 to 10000 pounds per square inch (psi).

2. The method of claim 1, wherein the stream of the liquid solvent is applied at a pressure more than 500 psi.

3. The method of claim 1, wherein the stream of the liquid solvent applied to the adhesive is provided in the form of a needle.

4. The method of claim 1, wherein the stream of the liquid solvent applied to the adhesive is provided in the form of a fan.

5. The method of claim 1, wherein the stream of the liquid solvent applied to the adhesive is provided in the form of a blade.

6. The method of claim 1, further comprising heating the liquid solvent to a temperature below the flashpoint of the liquid solvent before applying the stream of the liquid solvent.

7. The method of claim 1, wherein the adhesive comprises an adhesive layer between the carrier and workpiece of the carrier-workpiece pair, and wherein the stream of the liquid solvent is applied with a pump system allowing the stream of the liquid solvent to move in the three dimensions (X-Y-Z) relative to the adhesive and directed toward the adhesive layer between the carrier and workpiece of the carrier-workpiece pair.

8. The method of claim 7, wherein the stream of the liquid solvent is applied with the pump system allowing the stream of the liquid solvent to move at a linear or nonlinear velocity in the three dimensions (X-Y-Z).

9. The method of claim 1, wherein the adhesive comprises a thermoplastic polymer.

10. The method of claim 1, wherein the workpiece comprises a semiconductor wafer, an optical lens, quartz, a sapphire wafer, display glass, a liquid crystal display, a thin metal plate, a thin membrane, or a film.

11. The method of claim 10, wherein the workpiece of the carrier-workpiece pair has a thickness of less than 100 microns.

12. The method of claim 1, wherein the carrier-workpiece pair is held in place by a vacuum chuck, a frame, or a mechanical pin.

13. The method of claim 12, wherein the carrier of the carrier-workpiece pair is perforated, and the stream of the liquid solvent is applied to the adhesive from a back side of the carrier.

14. The method of claim 1, wherein the stream of the liquid solvent is applied to the adhesive at an angle ranging from 0-80 degrees with respect to the adhesive.

15. A method of debonding a temporarily bonded carrier-workpiece pair, comprising:
holding a carrier-workpiece pair temporarily bonded with a layer of a thermoplastic polymer adhesive; and
applying a stream of a liquid solvent to the layer of the thermoplastic polymer adhesive to debond the carrier-workpiece pair,
wherein the liquid solvent is capable of dissolving the thermoplastic polymer adhesive and the stream of the liquid solvent is applied via a nozzle in a pump system at a pressure ranging from 60 to 10000 pounds per square inch (psi) while controlling the position of the pump system,
wherein the pump system is movable in three dimensions (X-Y-Z) relative to an edge of the layer of the thermoplastic polymer adhesive.

16. The method of claim 15, wherein after the carrier-workpiece is debonded, further comprising cleaning the workpiece by applying a stream of the liquid solvent to the workpiece via the nozzle of the pumping system.

17. The method of claim 15, wherein the nozzle of the pumping system is configured to provide the stream of the liquid solvent in the form of a needle.

18. The method of claim 15, wherein the nozzle of the pump system is configured to provide the stream of the liquid solvent in the form of a fan or a blade.

19. The method of claim 15, wherein the nozzle of the pump system is movable or adjustable to allow the stream of the liquid solvent to move relative to the layer of the thermoplastic polymer adhesive in three dimensions (X-Y-Z).

20. The method of claim 19, wherein the nozzle of the pump system is movable at a linear or nonlinear speed in three dimensions (X-Y-Z).

* * * * *